(12) United States Patent
Kwon et al.

(10) Patent No.: US 9,721,499 B2
(45) Date of Patent: Aug. 1, 2017

(54) ORGANIC LIGHT EMITTING DIODE DISPLAY INCLUDING DRIVING VOLTAGE LINE

(71) Applicant: SAMSUNG DISPLAY CO., LTD., Yongin, Gyeonggi-Do (KR)

(72) Inventors: Do-Hyun Kwon, Yongin (KR); Il-Jeong Lee, Yongin (KR); Choong-Youl Im, Yongin (KR); Ju-Won Yoon, Yongin (KR); Moo-Soon Ko, Yongin (KR); Min-Woo Woo, Yongin (KR)

(73) Assignee: SAMSUNG DISPLAY CO., LTD., Tondin, Gyunggi-Do (KR)

( * ) Notice: Subject to any disclaimer, the term of this patent is extended or adjusted under 35 U.S.C. 154(b) by 0 days.

(21) Appl. No.: 14/100,349

(22) Filed: Dec. 9, 2013

(65) Prior Publication Data

US 2014/0320385 A1 Oct. 30, 2014

(30) Foreign Application Priority Data

Apr. 24, 2013 (KR) ........................ 10-2013-0045560

(51) Int. Cl.
*G09G 3/32* (2016.01)
*G09G 3/3233* (2016.01)
*H01L 27/32* (2006.01)

(52) U.S. Cl.
CPC ....... *G09G 3/3233* (2013.01); *H01L 27/3279* (2013.01); *G09G 2300/0426* (2013.01); *G09G 2300/0861* (2013.01); *H01L 27/3211* (2013.01)

(58) Field of Classification Search
CPC .................................................... G09G 3/3208
USPC ............................................................ 345/82
See application file for complete search history.

(56) References Cited

U.S. PATENT DOCUMENTS

| | | | | |
|---|---|---|---|---|
| 7,602,119 B2 * | 10/2009 | Miller | .................... | C09K 11/06 313/504 |
| 2004/0041753 A1 * | 3/2004 | Nakanishi | ........................ | 345/76 |
| 2004/0108978 A1 * | 6/2004 | Matsueda et al. | ............... | 345/76 |
| 2004/0257358 A1 * | 12/2004 | Okamoto | ............. | G09G 3/3233 345/211 |
| 2006/0097628 A1 * | 5/2006 | Suh et al. | ....................... | 313/504 |
| 2011/0267327 A1 * | 11/2011 | Hwang | ................ | G09G 3/3208 345/211 |
| 2011/0298694 A1 * | 12/2011 | Nieh | ........................ | G09G 3/30 345/76 |
| 2012/0056904 A1 * | 3/2012 | Lhee et al. | ..................... | 345/690 |

FOREIGN PATENT DOCUMENTS

JP 2004-127754 A 4/2004
KR 10-2006-0125634 A 12/2006

\* cited by examiner

*Primary Examiner* — Kwang-Su Yang
(74) *Attorney, Agent, or Firm* — Lee & Morse, P.C.

(57) ABSTRACT

An organic light emitting diode (OLED) display including a first pixel, a second pixel, and a third pixel disposed in a matrix and first to third driving voltage lines configured to transmit a driving voltage to the first to third pixel, respectively. A width of one driving voltage line among the first to third driving voltage lines is different from the width of the other driving voltage lines.

6 Claims, 6 Drawing Sheets

ORGANIC LIGHT EMITTING DIODE DISPLAY INCLUDING DRIVING VOLTAGE LINE

CROSS-REFERENCE TO RELATED APPLICATION

Korean Patent Application No. 10-2013-0045560, filed on Apr. 24, 2013, in the Korean Intellectual Property Office, and entitled: "Organic Light Emitting Diode Display," is incorporated by reference herein in its entirety.

BACKGROUND

1. Field

The described technology relates generally to an organic light emitting diode (OLED) display.

2. Description of the Related Art

An organic light emitting diode (OLED) display includes two electrodes and an organic emission layer between the two electrodes. Electrons injected from one electrode and holes injected from the other electrode are combined in the organic emission layer such that excitons are formed, and light is emitted by energy generated from the excitons.

The organic light emitting diode display includes a plurality of pixels including an organic light emitting diode that is a self-light emitting element, and a plurality of thin film transistors and at least one capacitor for driving the organic light emitting diode are formed in each pixel.

To prevent a voltage drop causing luminance non-uniformity for each color, a driving voltage line transmitting a driving voltage in the organic light emitting diode (OLED) display is formed with a mesh structure including a vertical driving voltage line and a horizontal driving voltage line.

SUMMARY

An organic light emitting diode (OLED) display including a first pixel, a second pixel, and a third pixel disposed in a matrix, wherein the organic light emitting diode (OLED) display includes a scan line configured to transmit a scan signal, a data line insulated from the scan line, the data line configured to transmit a data signal, and a driving voltage line insulated from the scan line, the driving voltage line including a first driving voltage line configured to transmit a driving voltage to the first pixel, a second driving voltage line configured to transmit the driving voltage to the second pixel, and a third driving voltage line configured to transmit the driving voltage to the third pixel, wherein a width of one driving voltage line among the first driving voltage line to the third driving voltage line is different from widths of other driving voltage lines.

The width of the one driving voltage lines may be larger than widths of the other driving voltage lines.

The first pixel, the second pixel, and the third pixel may be a red pixel, a green pixel, and a blue pixel, respectively, and the width of the second driving voltage line of the green pixel may be larger than the width of the third driving voltage line of the blue pixel.

The width of the first driving voltage line of the red pixel is larger than the width of the third driving voltage line of the blue pixel.

The width of the second driving voltage line of the green pixel may be the same as the width of the first driving voltage line of the red pixel.

A width of the driving voltage lines may increase as a luminance of an associated pixel to a voltage drop increases.

Widths of the first to third driving voltage lines may be all different.

The data line and the driving line may intersect the scan line.

The organic light emitting diode (OLED) display may include a switching transistor connected to the scan line and the data line, a driving transistor connected to the switching transistor and the driving voltage line, a pixel electrode connected to the driving transistor, an organic emission layer on the pixel electrode, and a common electrode on the organic emission layer.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Descriptions of parts not related to the embodiments are omitted, and like reference numerals designate like elements throughout the specification.

Further, in the embodiments, like reference numerals designate like elements throughout the specification representatively in a first embodiment, and only elements of embodiments other than those of the first embodiment will be described.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

Now, an organic light emitting diode (OLED) display according to the first exemplary embodiment will be described with reference to FIG. 1 to FIG. 5.

Figure 1:
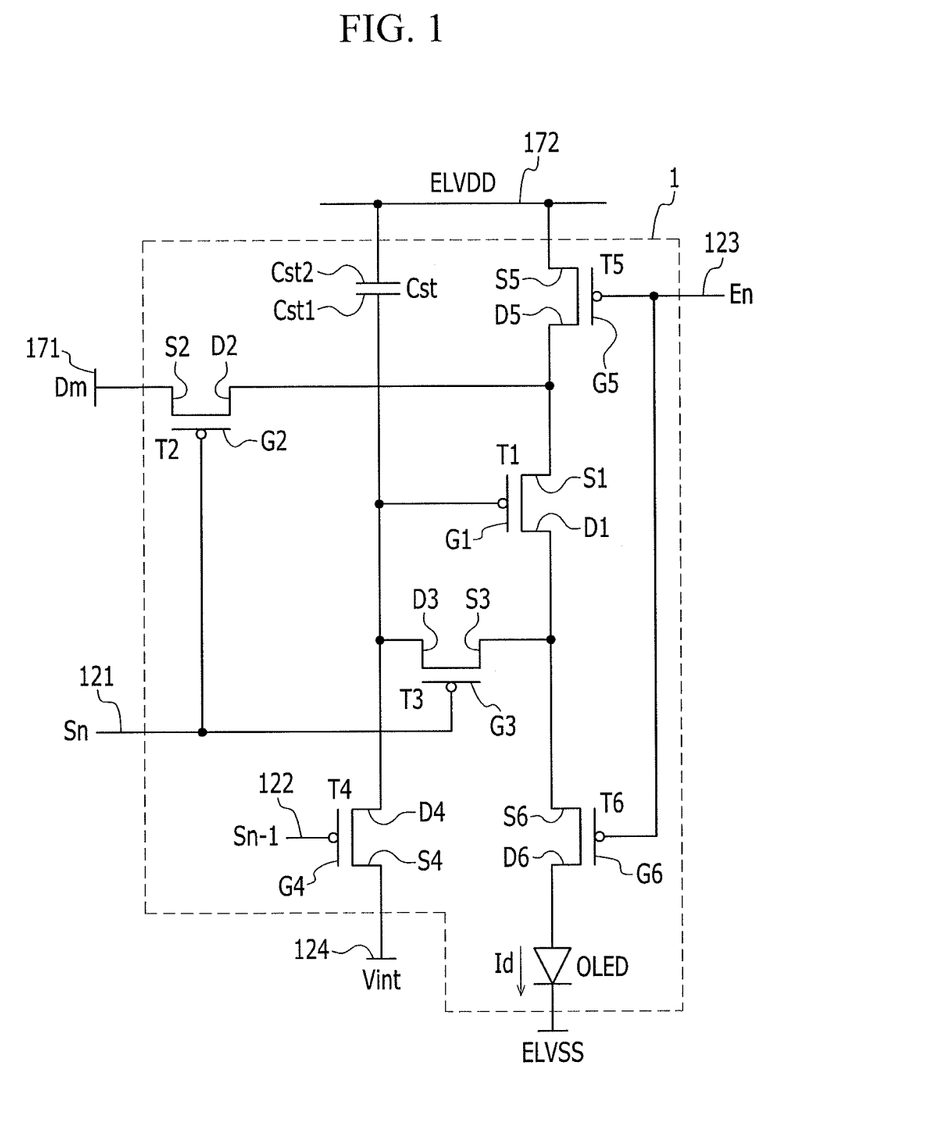
FIG. 1 illustrates an equivalent circuit of one pixel of an organic light emitting diode (OLED) display according to the first exemplary embodiment.

FIG. 1 illustrates an equivalent circuit of a pixel of an organic light emitting diode (OLED) display according to the first exemplary embodiment. As shown in FIG. 1, one pixel 1 of the organic light emitting diode display according to the first exemplary embodiment includes a plurality of signal lines 121, 122, 123, 124, 171, and 172, and a plurality of transistors T1, T2, T3, T4, T5, and T6, a storage capacitor Cst, and an organic light emitting diode (OLED) connected to the plurality of signal lines.

The plurality of transistors includes a driving transistor (driving thin film transistor) T1, a switching transistor (switching thin film transistor) T2, a compensation transistor T3, an initialization transistor T4, an operation control transistor T5, and a light emission control transistor T6.

The plurality of signal lines includes a scan line 121 transferring a scan signal Sn, a prior scan line 122 transferring a prior scan signal Sn-1 to the initialization transistor T4, a light emission control line 123 transferring a light emission control signal En to the operation control transistor T5 and the light emission control transistor T6, a data line 171 crossing the scan line 121 and transferring a data signal Dm, a driving voltage line 172 transferring a driving voltage ELVDD and formed substantially parallel to the data line 171, and an initialization voltage line 124 transferring an initialization voltage Vint initializing the driving transistor T1.

A gate electrode G1 of the driving transistor T1 is connected to a first end Cst1 of the storage capacitor Cst, a source electrode S1 of the driving transistor T1 is connected via the operation control transistor T5 to the driving voltage line 172, and the drain electrode D1 of the driving transistor T1 is electrically connected via the light emission control transistor T6 to an anode of the organic light emitting diode (OLED). The driving transistor T1 receives the data signal Dm according to a switching operation of the switching transistor T2 to supply a driving current Id to the organic light emitting diode (OLED).

A gate electrode G2 of the switching transistor T2 is connected to the scan line 121, a source electrode S2 of the switching transistor T2 is connected to the data line 171, and a drain electrode D2 of the switching transistor T2 is connected via the operation control transistor T5 to the driving voltage line 172 while being connected to the source electrode S1 of the driving transistor T1. The switching transistor T2 is turned on according to the scan signal Sn transferred through the scan line 121 to perform a switching operation for transferring the data signal Dm transferred to the data line 171 to the source electrode of the driving transistor T1.

A gate electrode G3 of the compensation transistor T3 is connected to the scan line 121, a source electrode S3 of the compensation transistor T3 is connected via the light emission control transistor T6 to the anode of the organic light emitting diode (OLED) while being connected to the drain electrode D1 of the driving transistor T1, and a drain electrode D3 of the compensation transistor T3 is connected to the first end Cst1 of the storage capacitor Cst, a drain electrode D4 of the initialization transistor T4, and the gate electrode G1 of the driving transistor T1. The compensation transistor T3 is turned on according to the scan signal Sn transferred through the scan line 121 to connect the gate electrode G1 and the drain electrode D1 of the driving transistor T1 to each other, thus performing diode-connection of the driving transistor T1.

A gate electrode G4 of the initialization transistor T4 is connected to the prior scan line 122, the source electrode S4 of the initialization transistor T4 is connected to the initialization voltage line 124, and the drain electrode D4 of the initialization transistor T4 is connected to one end Cst1 of the storage capacitor Cst, the drain electrode D3 of the compensation transistor T3, and the gate electrode G1 of the driving transistor T1. The initialization transistor T4 is turned on according to the prior scan signal Sn-1 transferred through the prior scan line 122 to transfer the initialization voltage Vint to the gate electrode G1 of the driving transistor T1, thus performing an initialization operation for initializing the voltage of the gate electrode G1 of the driving transistor T1.

A gate electrode G5 of the operation control transistor T5 is connected to the light emission control line 123, a source electrode S5 of the operation control transistor T5 is connected to the driving voltage line 172, and a drain electrode D5 of the operation control transistor T5 is connected to the source electrode S1 of the driving transistor T1 and the drain electrode S2 of the switching transistor T2.

A gate electrode G6 of the light emission control transistor T6 is connected to the light emission control line 123, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the organic light emitting diode (OLED). The operation control transistor T5 and the light emission control transistor T6 are simultaneously turned on according to the light emission control signal En transferred through the light emission control line 123 to transfer the driving voltage ELVDD to the organic light emitting diode (OLED), thus allowing the driving current Id to flow in the organic light emitting diode (OLED).

A second end Cst2 of the storage capacitor Cst is connected to the driving voltage line 172. A cathode of the organic light emitting diode (OLED) is connected to a common voltage ELVSS. Accordingly, the organic light emitting diode (OLED) receives the driving current Id from the driving transistor T1 to emit light, thereby displaying an image.

Hereinafter, an operation process of one pixel of the organic light emitting diode display according to the exemplary embodiment will be described in detail.

First, the prior scan signal Sn-1 at a low level is supplied through the prior scan line 122 during an initialization period. Then, the initialization transistor T4 is turned on corresponding to the prior scan signal Sn-1 at the low level, and the initialization voltage Vint is connected from the initialization voltage line 124 through the initialization transistor T4 to the gate electrode of the driving transistor T1 to initialize the driving transistor T1 by the initialization voltage Vint.

Subsequently, the scan signal Sn at the low level is supplied through the scan line 121 during a data programming period. Then, the switching transistor T2 and the compensation transistor T3 are turned on corresponding to the scan signal Sn at the low level. In this case, the driving transistor T1 is diode-connected by the turned-on compensation transistor T3, and biased in a forward direction.

Then, a compensation voltage Dm+Vth (Vth is a negative value) obtained by subtracting a threshold voltage Vth of the driving transistor T1 from the data signal Dm supplied from the data line 171 is applied to the gate electrode of the driving transistor T1.

The driving voltage ELVDD and the compensation voltage Dm+Vth are applied to both ends of the storage capacitor Cst, and a charge corresponding to a difference between voltages at both ends is stored in the storage capacitor Cst. Thereafter, the level of the light emission control signal En supplied from the light emission control line 123 during the light emission period is changed from the high level to the low level. Then, the operation control transistor T5 and the light emission control transistor T6 are turned on by the light emission control signal En at the low level during the light emission period.

Then, the driving current Id is generated according to a difference between the voltage of the gate electrode of the driving transistor T1 and the driving voltage ELVDD, and the driving current Id is supplied through the light emission control transistor T6 to the organic light emitting diode (OLED). A gate-source voltage Vgs of the driving transistor T1 is maintained at "(Dm+Vth)-ELVDD" by the storage capacitor Cst during the light emission period, and the driving current Id is proportional to a square of a value obtained by subtracting the threshold voltage from a source-gate voltage, that is, "(Dm-ELVDD)2", according to a current-voltage relationship of the driving transistor T1. Accordingly, the driving current Id is determined regardless of the threshold voltage Vth of the driving transistor T1.

Now, a detailed structure of the pixel of the organic light emitting diode display illustrated in FIG. 1 will be described in detail with reference to FIGS. 2 to 5 together with FIG. 1.

Figure 2:
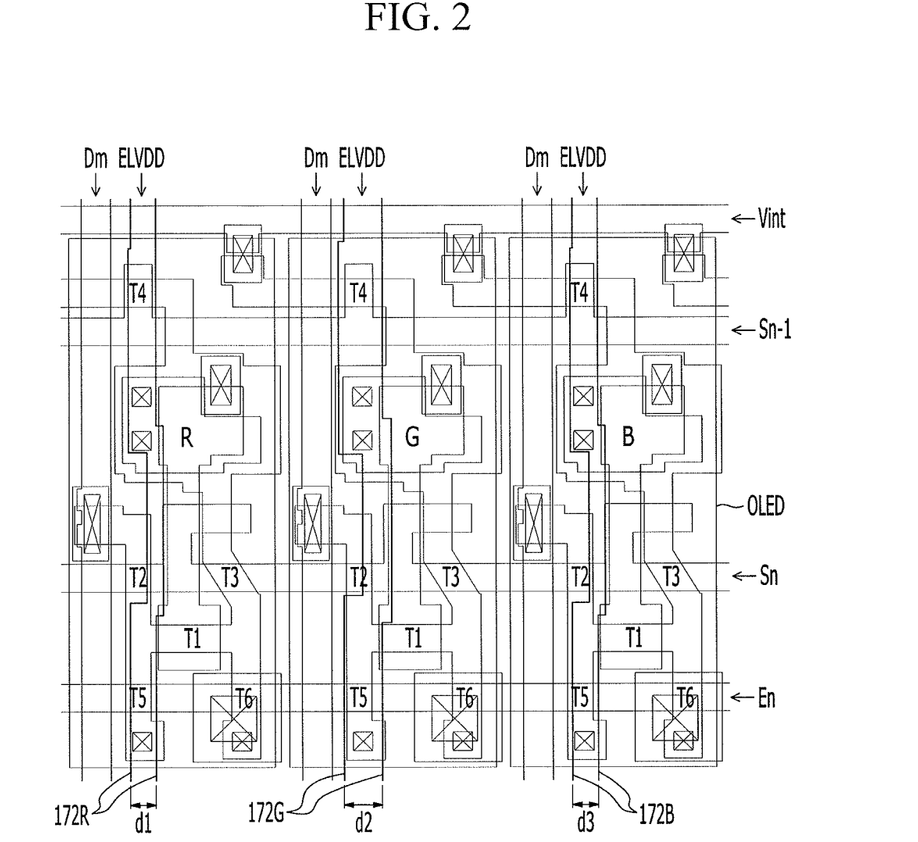
FIG. 2 illustrates a schematic view of positions of a plurality of thin film transistors and capacitors of a first pixel to a third pixel of an organic light emitting diode (OLED) display according to the first exemplary embodiment.
Figure 3:
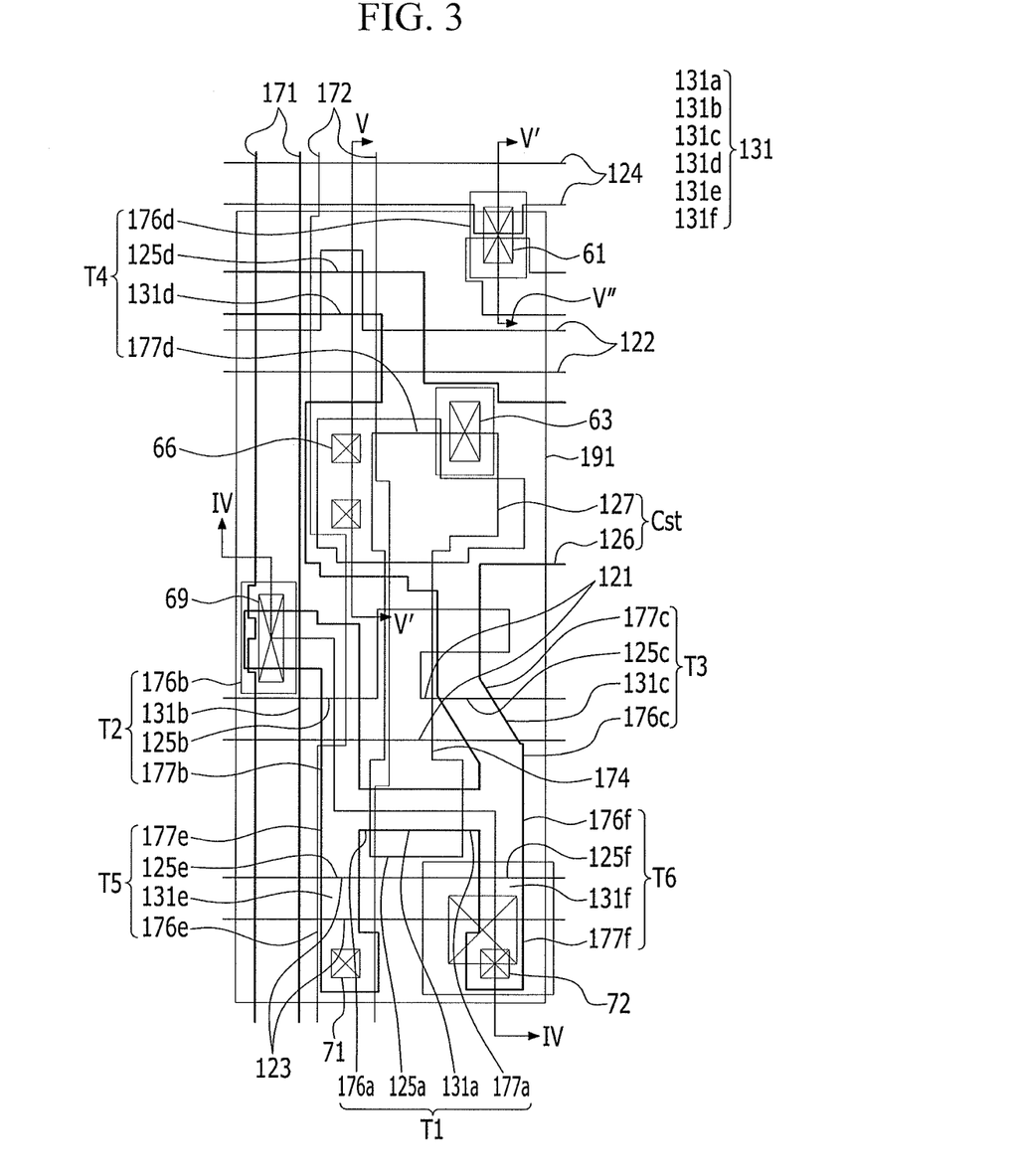
FIG. 3 illustrates a layout view of a pixel of an organic light emitting diode (OLED) display according to the first exemplary embodiment.
Figure 4:
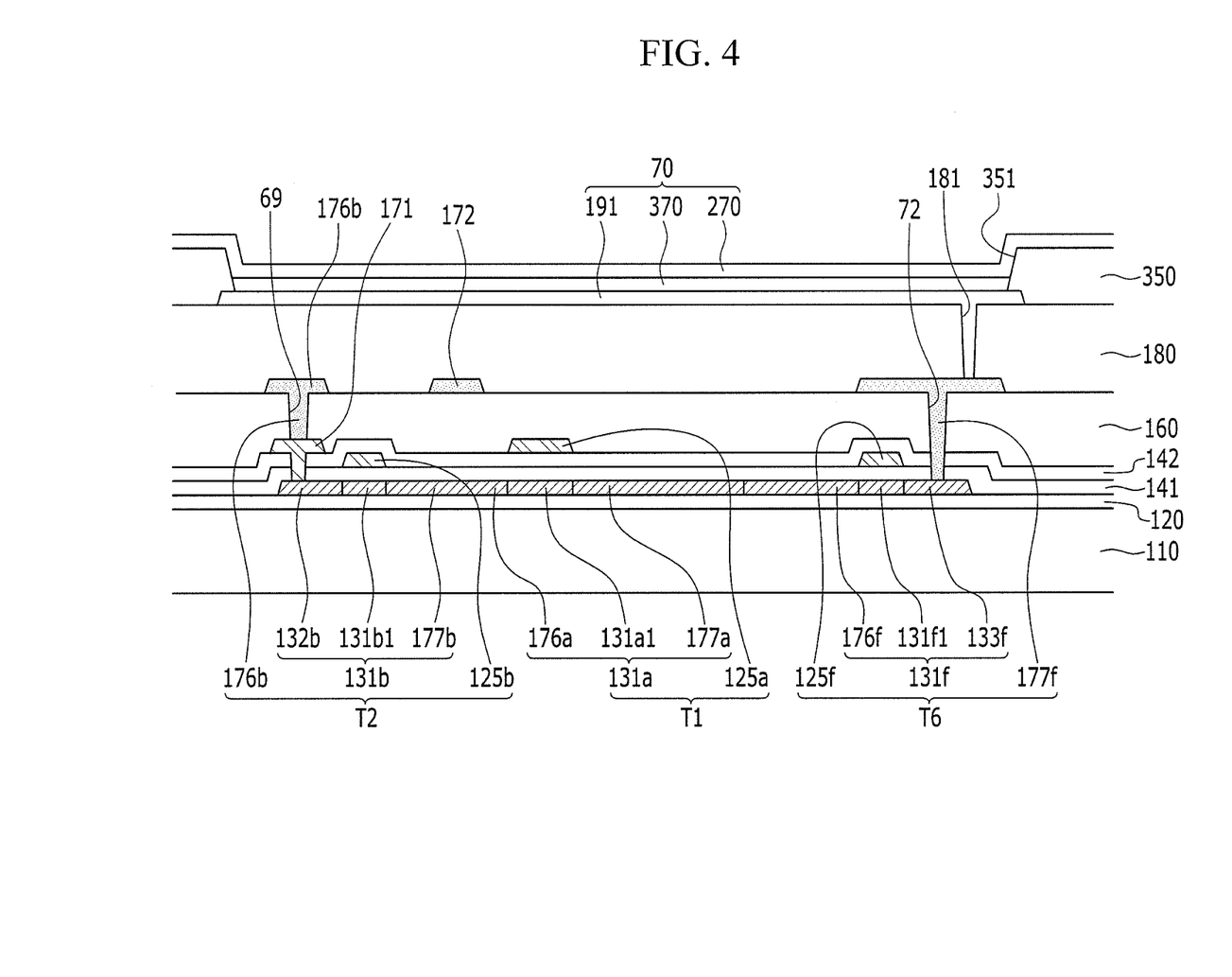
FIG. 4 illustrates a cross-sectional view of the organic light emitting diode (OLED) display of FIG. 3 taken along the line IV-IV.
Figure 5:
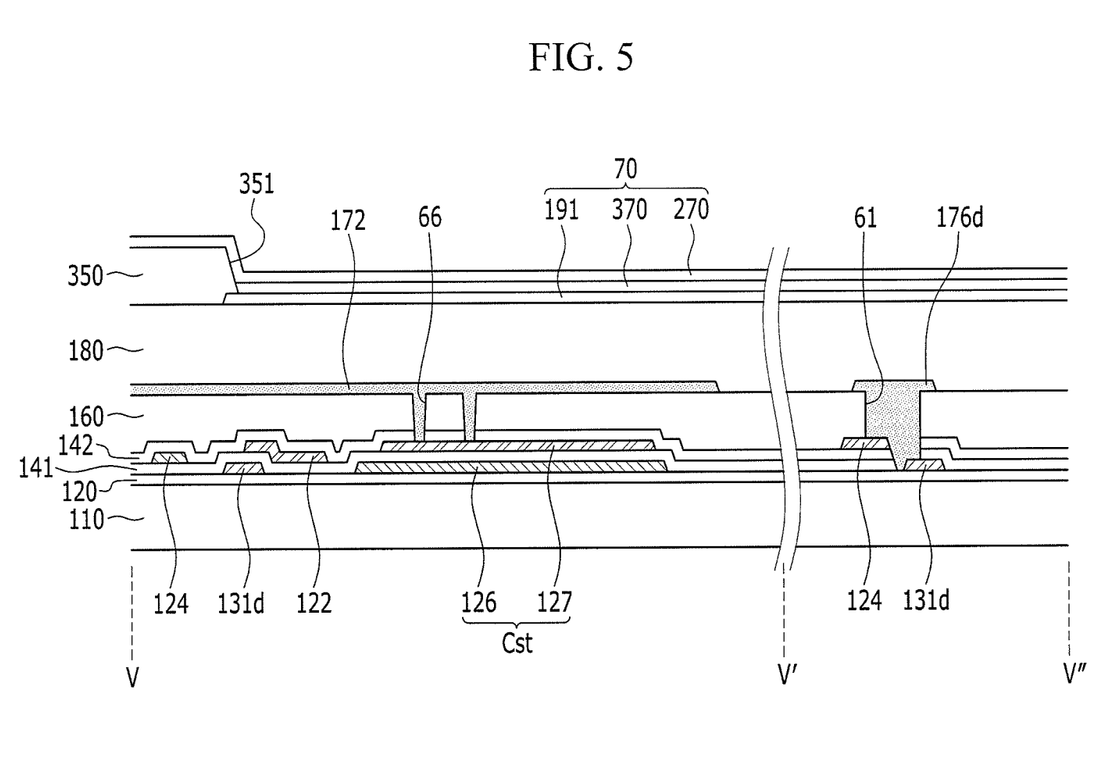
FIG. 5 illustrates a cross-sectional view of the organic light emitting diode (OLED) display of FIG. 3 taken along the lines V-V' and V'-V".

FIG. 2 illustrates a schematic view of a position of a plurality of thin film transistors and capacitors of a first pixel to a third pixel of an organic light emitting diode (OLED) display according to the first exemplary embodiment. FIG. 3 illustrates a layout view of a pixel of an organic light emitting diode (OLED) display according to the first exemplary embodiment. FIG. 4 illustrates a cross-sectional view of the organic light emitting diode (OLED) display of FIG. 3 taken along the line IV-IV. FIG. 5 illustrates a cross-sectional view of the organic light emitting diode (OLED) display of FIG. 3 taken along the lines V-V' and V'-V".

As shown in FIG. 2, a first pixel, a second pixel, and a third pixel are alternately disposed in one row of the organic light emitting diode (OLED) display according to the first exemplary embodiment. The first pixel may be a red pixel (R) displaying red, the second pixel may be a green pixel (G) displaying green, and the third pixel may be a blue pixel (B) displaying blue. The red pixel R, the green pixel G, and the blue pixel B form one group, and are repeatedly arranged according to rows.

Pixels of the same color may be disposed in the same column. That is, red pixels (R) may be disposed at the first column, green pixels (G) may be disposed at the second column, and blue pixels (B) may be disposed at the third column.

In the first pixel to the third pixel, the structure of the scan line 121, the data line 171, and the thin film transistors T1, T2, T3, T4, T5, and T6 may be the same, while at least one of the individual driving voltage lines may be different. Accordingly, the same constituent elements are designated by the same reference numerals.

One pixel among the first pixel to the third pixel includes the scan line 121, the prior scan line 122, the light emission control line 123, and the initialization voltage line 124 applying the scan signal Sn, the prior scan signal Sn-1, the light emission control signal En, and the initialization voltage Vint, respectively, and formed in a row direction, and the data line 171 and the driving voltage line 172 crossing all of the scan line 121, the prior scan line 122, the light emission control line 123, and the initialization voltage line 124 and respectively applying the data signal Dm and the driving voltage ELVDD.

Further, the driving transistor T1, the switching transistor T2, the compensation transistor T3, the initialization transistor T4, the operation control transistor T5, the light emission control transistor T6, the storage capacitor Cst, and the organic light emitting diode (OLED) are formed in the pixel.

The driving transistor T1, the switching transistor T2, the compensation transistor T3, the initialization transistor T4, the operation control transistor T5, and the light emission control transistor T6 are formed along a semiconductor layer 131, and the semiconductor layer 131 is formed to be bent in various shapes. The semiconductor layer 131 may be formed of polysilicon or an oxide semiconductor. The oxide semiconductor may include any one of oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as zinc oxide (ZnO), indium-gallium-zinc oxide (InGaZnO4), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). In the case where the semiconductor layer 131 is formed of the oxide semiconductor, a separate protective layer may be added to protect the oxide semiconductor that is weak with regard to an external environment such as high temperatures.

The semiconductor layer 131 includes a channel region that is subjected to channel doping with an N-type impurity or a P-type impurity, and a source region and a drain region that are formed at respective sides of the channel region and formed by doping a doping impurity having a type that is opposite to that of the doping impurity doped in the channel region.

Hereinafter, a plan view of the organic light emitting diode display according to the exemplary embodiment will be first described in detail with reference to FIGS. 2 and 3, and a cross-sectional structure thereof will be described in detail with reference to FIGS. 4 and 5.

Firstly, as shown in FIG. 2 and FIG. 3, the pixel 1 of the organic light emitting diode display according to the first exemplary embodiment includes the driving transistor T1, the switching transistor T2, the compensation transistor T3, the initialization transistor T4, the operation control transistor T5, the light emission control transistor T6, the storage capacitor Cst, and the organic light emitting diode (OLED), the transistors T1, T2, T3, T4, T5, and T6 are formed along the semiconductor layer 131. The semiconductor layer 131 includes a driving semiconductor layer 131a formed in the driving transistor T1, a switching semiconductor layer 131b formed in the switching transistor T2, a compensation semiconductor layer 131c formed in the compensation transistor T3, an initialization semiconductor layer 131d formed in the initialization transistor T4, an operation control semiconductor layer 131e formed in the operation control transistor T5, and a light emission control semiconductor layer 131f formed in the light emission control transistor T6.

The driving transistor T1 includes the driving semiconductor layer 131a, a driving gate electrode 125a, a driving source electrode 176a, and a driving drain electrode 177a. The driving source electrode 176a corresponds to a driving source region 176a doped with the impurity in the driving semiconductor layer 131a and the driving drain electrode 177a corresponds to a driving drain region 177a doped with the impurity in the driving semiconductor layer 131a. The driving gate electrode 125a overlaps the driving semiconductor layer 131a, and may be formed with the same material and the same layer as the data line 171 and a connection member 174.

The switching transistor T2 includes the switching semiconductor layer 131b, a switching gate electrode 125b, a switching source electrode 176b, and a switching drain electrode 177b. The switching source electrode 176b is connected to the data line 171 through a contact hole 69, and the switching drain electrode 177b corresponds to the switching drain region 177b doped with the impurity in the switching semiconductor layer 131b.

The switching gate electrode 125b is formed with the same material and the same layer as the scan line 121, the prior scan line 122, the light emission control line 123, the initialization voltage line 124, the compensation gate electrode 125c, the initialization gate electrode 125d, the operation control gate electrode 125e, the light emission control gate electrode 125f, and a second storage capacitive plate 127.

The compensation transistor T3 includes the compensation semiconductor layer 131c, a compensation gate electrode 125c, a compensation source electrode 176c, and a compensation drain electrode 177c, the compensation source electrode 176c corresponds to a compensation source region 176c doped with the impurity in the compensation semiconductor layer 131c, and the compensation drain electrode 177c is a portion protruding from the connection member 174.

The initialization transistor T4 includes the initialization semiconductor layer 131d, an initialization gate electrode 125d, an initialization source electrode 176d, and an initialization drain electrode 177d. The initialization source electrode 176d is connected through a contact hole 61 continuously formed in a first gate insulating layer 141, a second gate insulating layer 142, and an interlayer insulating layer 160 to the initialization voltage line 124 and the initialization semiconductor layer 131d simultaneously, and the initialization drain electrode 177d is a second end of the connection member 174 and is connected through a contact hole 63 continuously formed in the first gate insulating layer 141 and the second gate insulating layer 142 to the initialization semiconductor layer 131d.

The operation control transistor T5 includes the operation control semiconductor layer 131e, an operation control gate electrode 125e, an operation control source electrode 176e, and an operation control drain electrode 177e. The operation control source electrode 176e as a portion of the driving voltage line 172 is connected to the operation control source region 132e through a contact hole 71, and the operation control drain electrode 177e corresponds to the operation control drain region 177e doped with the impurity in the operation control semiconductor layer 131e.

The light emission control thin film transistor T6 includes the light emission control semiconductor layer 131f, a light emission control gate electrode 125f, a light emission control source electrode 176f, and a light emission control drain electrode 177f. The light emission control source electrode 176f corresponds to the light emission control source region 176f doped with the impurity in the light emission control semiconductor layer 131f.

One terminal of the driving semiconductor layer 131a of the driving thin film transistor T1 is connected to the switching semiconductor layer 131b and the operation control semiconductor layer 131e, and the other terminal of the driving semiconductor layer 131a is connected to the compensation semiconductor layer 131c and the light emission control semiconductor layer 131f. Accordingly, the driving source electrode 176a is connected to the switching drain electrode 177b and the operation control drain electrode 177e, and the driving drain electrode 177a is connected to the compensation source electrode 176c and the light emission control source electrode 176f.

The storage capacitor Cst includes a first storage capacitive plate 126 and the second storage capacitive plate 127 disposed via the first gate insulating layer 141 and the second gate insulating layer 142. The first storage capacitive plate 126 may be formed with the same layer and the same material as the semiconductor layer 131. The second storage capacitive plate 127 may be formed with the same layer and the same material as the scan line 121, the prior scan line 122, the light emission control line 123, the initialization voltage line 124, the switching gate electrode 125b, the compensation gate electrode 125c, the initialization gate electrode 125d, the operation control gate electrode 125e, and the light emission control gate electrode 125f.

The first gate insulating layer 141 and the second gate insulating layer 142 are a dielectric material. Storage capacitance is determined by the charge charged in the storage capacitor Cst and the voltage between both capacitive plates 126 and 127.

The driving voltage line 172 may overlap and pass through the storage capacitor Cst, and may cross the scan line 121, the prior scan line 122, the light emission control line 123, and the initialization voltage line 124. A portion of the driving voltage line 172 corresponds to the operation control source electrode 176e and is connected to the operation control source region 132e through the contact hole 71, and another portion of the driving voltage line 172 is connected to the second storage capacitive plate 127 through a contact hole 66 formed in the interlayer insulating layer 160 and the second gate insulating layer 142.

The driving voltage line 172 includes a first driving voltage line 172R transmitting the driving voltage to the red pixel (R) of the first pixel, a second driving voltage line 172G transmitting the driving voltage to the green pixel (G) of the second pixel, and a third driving voltage line 172B transmitting the driving voltage to the blue pixel (B) of the third pixel.

The width of a driving voltage line of the pixel in which the luminance is sensitive to the voltage change among the first driving voltage line to the third driving voltage line is larger than the width of the other driving voltage lines, thereby improving luminance uniformity for each pixel.

For example, the width d2 of the second driving voltage line 172G of the green pixel (G) in which the luminance is relatively sensitive to the voltage change may be larger than the width d3 of the third driving voltage line 172B of the blue pixel (B) in which the luminance is relatively insensitive to the voltage change. In this case, the second driving voltage line 172G of the green pixel (G) has a smaller resistance such that the voltage drop (IR drop) generated is smaller than that in the third driving voltage line 172B of the blue pixel (B), such that the luminance change of the green pixel (G) is improved. In particular, luminance uniformity of the entire organic light emitting diode (OLED) display may be improved by reducing the luminance change of the green pixel (G) that mostly influences the luminance uniformity for the entire pixel.

As described above, although the driving voltage line of the mesh structure is not formed, the width of one driving voltage line among the first driving voltage line to the third driving voltage line is differently formed from the width of the other driving voltage lines, thereby improving the luminance uniformity for each pixel.

The connection member 174 parallel to the driving voltage line 172 may be formed with the same layer as the data line 171. The connection member 174 connects the driving gate electrode 125a and the first storage capacitive plate 126. Accordingly, the storage capacitor Cst stores a storage capacitance corresponding to a difference between the driving voltage ELVDD transferred through the driving voltage line 172 and the gate voltage of the driving gate electrode 125a.

The switching transistor T2 is used as a switching element selecting the pixel that is to emit light. The switching gate electrode 125b is connected to the scan line 121, the switching source electrode 176b is connected to the data line 171, and the switching drain electrode 177b is connected to the driving transistor T1 and the operation control transistor T5. In addition, the light emission control drain electrode 177f of the light emission control transistor T6 is directly connected through a contact hole 181 formed in a protective layer 180 to a pixel electrode 191 of an organic light emitting diode 70.

Hereinafter, referring to FIG. 4 and FIG. 5, a structure of the organic light emitting diode display according to the exemplary embodiment will be described in detail according to the deposition order.

In this case, the structure of the transistor will be described based on the driving transistor T1, the switching transistor T2, and the light emission control transistor T6. In addition, the compensation transistor T3 and the initialization transistor T4 have almost the same lamination structure as the switching transistor T2, and the operation control transistor T5 has almost the same lamination structure as the light emission control transistor T6, so they are not described in further detail.

A buffer layer 120 is formed on a substrate 110, and the substrate 110 is formed of an insulating substrate made of glass, quartz, ceramics, plastics, or the like.

The driving semiconductor layer 131a, the switching semiconductor layer 131b, the light emission control semiconductor layer 131f, and the first storage capacitive plate 126 are formed on the buffer layer 120. The driving semiconductor layer 131a includes a driving channel region 131a1, and the driving source region 176a and the driving drain region 177a facing each other with the driving channel region 131a1 interposed therebetween, the switching semiconductor layer 131b includes a switching channel region 131b1, and a switching source region 132b and a switching drain region 177b facing each other with the switching channel region 131b1 interposed therebetween, and the light emission control transistor T6 includes a light emission control channel region 131f1, the light emission control source region 176f, and a light emission control drain region 133f.

The first gate insulating layer 141 is formed on the switching semiconductor layer 131a, the driving semiconductor layer 131b, and the light emission control semiconductor layer 131f. The first gate insulating layer 141 includes an insulating material, and may be formed of a high dielectric constant material, e.g., HfOx, ZrOx, AlOx, and SiOx.

The first gate wire (121, 122, 123, 124, 125b, and 125O including the scan line 121 including the switching gate electrode 125b, the prior scan line 122, the light emission control line 123 including the light emission control gate electrode 125f, the initialization voltage line 124, and the second storage capacitive plate 127 is formed on the first gate insulating layer 141.

The second gate insulating layer 142 is formed on the first gate wire (121, 122, 123, 124, 125b, and 125O and the first gate insulating layer 141. The second gate insulating layer 142 is formed of silicon nitride (SiNx) or silicon oxide (SiO$_2$).

The second gate wire (125a and 171) including the driving gate electrode 125a and the data line 171 is formed on the second gate insulating layer 142.

As described above, the first gate insulating layer 141 and the second gate insulating layer 142 are formed between the driving semiconductor layer 131a and the driving gate electrode 125a, such that an interval between the driving semiconductor layer 131a and the driving gate electrode 125a is widened. Accordingly, the driving range of the gate voltage applied to the driving gate electrode 125a is broadened to display all grayscales.

The first gate insulating layer 141 formed between the first storage capacitive plate 126 and the second storage capacitive plate 127 may be relatively thin, such that the storage capacitance may be improved. In this case, to prevent damage of the first storage capacitive plate 126 during the manufacturing process of the second storage capacitive plate 127, the first storage capacitive plate 126 may be larger than the second storage capacitive plate 127.

The interlayer insulating layer 160 is formed on the second gate wire (125a and 171) and the second gate insulating layer 142. The interlayer insulating layer 160 may be made of a ceramic-based material, e.g., silicon nitride (SiNx) or silicon oxide (SiO2).

A data wire including the switching source electrode 176b and the driving voltage line 172 including the light emission control drain electrode 177f is formed on the interlayer insulating layer 160.

The light emission control drain electrode 177f is connected to the light emission control drain region 133f of the light emission control semiconductor layer 131f through a contact hole 72 formed in the first gate insulating layer 141, the second gate insulating layer 142, and the interlayer insulating layer 160.

The protective layer 180 covering the data wires 172, 176b, and 177f is formed on the interlayer insulating layer 160, and the pixel electrode 191 is formed on the protective layer 180. The pixel electrode 191 is connected to the light emission control drain electrode 177f through the contact hole 181 formed in the protective layer 180.

A barrier rib 350 is formed on an edge of the pixel electrode 191 and the protective layer 180, and the barrier rib 350 has a barrier rib opening 351 through which the pixel electrode 191 is exposed. The barrier rib 350 may be made of a resin, e.g., a polyacrylate and a polyimide, or of silica-based inorganic materials.

An organic emission layer 370 is formed on the pixel electrode 191 exposed through the barrier rib opening 351, and a common electrode 270 is formed on the organic emission layer 370. The organic light emitting diode 70 including the pixel electrode 191, the organic emission layer 370, and the common electrode 270 is formed as described above.

The pixel electrode 191 is an anode that is a hole injection electrode, and the common electrode 270 is a cathode that is an electron injection electrode. However, embodiments are not limited thereto, and the pixel electrode 191 may be the cathode and the common electrode 270 may be the anode according to the driving method of the organic light emitting diode display. Holes and electrons are injected from the pixel electrode 191 and the common electrode 270 into the organic emission layer 370, and when an exciton that is a combination of an injected hole and an injected electron falls from an exited state to a ground state, light is emitted.

The organic emission layer 370 is formed of a low molecular weight organic material or a high molecular weight organic material such as PEDOT (poly(3,4-ethylenedioxythiophene)). Further, the organic emission layer 370 may be formed of a multilayer including one or more of an emission layer, a hole injection layer HIL, a hole transport layer HTL, an electron transport layer ETL, and an electron injection layer EIL. In the case where all the layers are included, the hole injection layer HIL is disposed on the pixel electrode 191 that is the anode, and the hole transport layer HTL, the emission layer, the electron transport layer ETL, and the electron injection layer EIL are sequentially laminated thereon.

The organic emission layer 370 may include a red organic emission layer emitting light having a red color, a green organic emission layer emitting light having a green color, and a blue organic emission layer emitting light having a blue color, and the red organic emission layer, the green organic emission layer, and the blue organic emission layer are respectively formed in a red pixel, a green pixel, and a blue pixel to implement a color image.

Further, the organic emission layer 370 may implement the color image by laminating all of the red organic emission layer, the green organic emission layer, and the blue organic emission layer in the red pixel, the green pixel, and the blue pixel together, and forming a red color filter, a green color filter, and a blue color filter for each pixel. As another example, a white organic emission layer emitting light having a white color may be formed in all of the red pixel, the green pixel, and the blue pixel, and the red color filter, the green color filter, and the blue color filter may be formed for each pixel to implement the color image. When the color image is implemented by using the white organic emission layer and the color filter, deposition masks for depositing the red organic emission layer, the green organic emission layer, and the blue organic emission layer on each pixel, i.e., the red pixel, the green pixel, and the blue pixel, may be omitted.

A white organic emission layer described in another example may be formed of one organic emission layer, and includes a constitution in which a plurality of organic emission layers are laminated to emit light having the white color. For example, a constitution in which at least one yellow organic emission layer and at least one blue organic emission layer are combined to emit light having the white color, a constitution in which at least one cyan organic emission layer and at least one red organic emission layer are combined to emit light having the white color, a constitution in which at least one magenta organic emission layer and at least one green organic emission layer are combined to emit light having the white color, or the like, may be included.

Since the common electrode 270 is formed of a reflective conductive material, a rear surface light emission type of organic light emitting diode display is obtained. A material such as lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as the reflective material.

In the first exemplary embodiment, the width of the second driving voltage line of the green pixel is different from the width of the first driving voltage line of the red pixel, however the second exemplary embodiment in which the width of the second driving voltage line of the green pixel is the same as the width of the first driving voltage line of the red pixel is possible.

Hereafter, an organic light emitting diode (OLED) display according to the second exemplary embodiment will be described with reference to FIG. 6.

Figure 6:
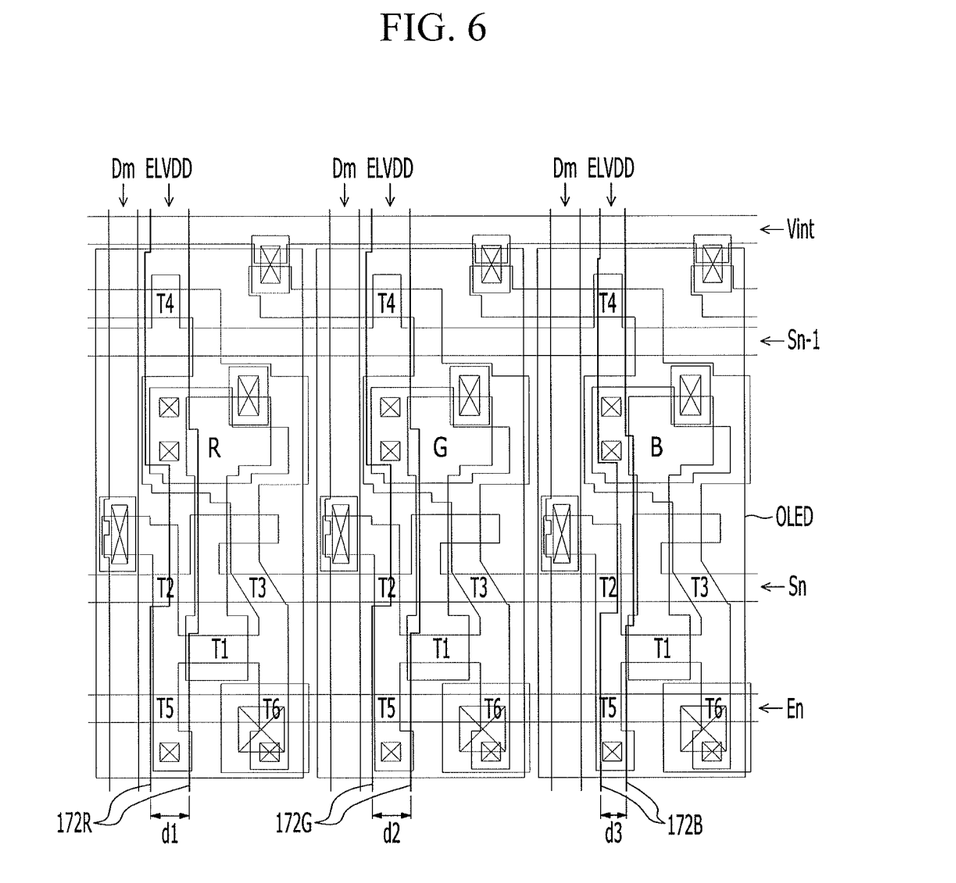
FIG. 6 illustrates a schematic view of positions of a plurality of thin film transistors and capacitors of a first pixel to a third pixel of an organic light emitting diode (OLED) display according to the second exemplary embodiment.

FIG. 6 illustrates a layout view of an organic light emitting diode (OLED) display according to the second exemplary embodiment.

The second exemplary embodiment is substantially equivalent to the first exemplary embodiment shown in FIG. 1 and FIG. 2, except for a relative size of the width of the second driving voltage line of the green pixel and the width of the first driving voltage line of the red pixel.

As shown in FIG. 6, in the organic light emitting diode (OLED) display according to the second exemplary embodiment, the width d2 of the second driving voltage line 172G of the green pixel (G) in which the luminance is relatively sensitive to the voltage change may be larger than the width d3 of the third driving voltage line 172B of the blue pixel (B) in which the luminance is relatively insensitive to the voltage change, and the width d1 of the first driving voltage line 172R of the red pixel (R) in which the luminance is relatively sensitive to the voltage change may be larger than the width d3 of the third driving voltage line 172B of the blue pixel (B) in which the luminance is relatively insensitive to the voltage change. Here, the width d2 of the second driving voltage line 172G of the green pixel (G) may be the same as the width d1 of the first driving voltage line 172R of the red pixel (R).

In this case, the resistance of the second driving voltage line 172G of the green pixel (G) and the first driving voltage line 172R of the red pixel (R) is decreased such that the voltage drop (IR drop) is less than in the third driving voltage line 172B of the blue pixel (B), such that the luminance change of the green pixel (G) and the red pixel (R) is improved. In particular, the luminance uniformity of the entire organic light emitting diode (OLED) display may be improved by the improvement of the luminance change of the green pixel (G) and the red pixel (R) that influence the luminance uniformity for the entire pixel more than the blue pixel (B).

As a further alternative, all widths of the first to third driving voltage lines may be different, increasing in width for the blue (B), red (R), and green (G) pixels, respectively.

Previously, an upper storage capacitive plate was formed to be larger than the lower storage capacitive plate to reduce a variation of a storage capacitance, and the upper storage capacitive plate was used as the horizontal driving voltage line. However, in high resolution organic light emitting diode (OLED) displays, to improve the storage capacitance, a thin dielectric layer is used and the lower storage capacitive plate is larger than the upper storage capacitive plate to reduce manufacturing defects, i.e., the upper storage capacitive plate is not continuous. Accordingly, the upper storage capacitive plate may not be used as the horizontal driving voltage line. Thus, the driving voltage line of the mesh structure may not be used. Accordingly, it is difficult to prevent the voltage drop causing the non-uniform luminance for each color in the high resolution organic light emitting diode (OLED) display.

In contrast, as described above in accordance with embodiments, even without the driving voltage line of the mesh structure, the width of one driving voltage line among the first driving voltage line to the third driving voltage line is different than the width of the other driving voltage lines such that the luminance uniformity for each pixel may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode (OLED) display including a first pixel, a second pixel, and a third pixel disposed in a matrix, the organic light emitting diode (OLED) display comprising:
a scan line configured to transmit a scan signal;
a data line insulated from the scan line, the data line configured to transmit a data signal; and
a driving voltage line insulated from the scan line, the driving voltage line including a first driving voltage line configured to transmit a driving voltage to the first pixel, a second driving voltage line configured to transmit the driving voltage to the second pixel, and a third driving voltage line configured to transmit the driving voltage to the third pixel,
wherein:
a width of one driving voltage line among the first driving voltage line to the third driving voltage line is different from widths of other driving voltage lines among the first to third driving voltage lines,
a width of the driving voltage lines corresponds to a luminance change of an associated pixel to a voltage drop such that the first pixel, the second pixel, and the third pixel have uniform luminance,
the first pixel, the second pixel, and the third pixel are a red pixel, a green pixel, and a blue pixel, respectively,
the width of the second driving voltage line of the green pixel is larger than the width of the third driving voltage line of the blue pixel, and
the width of the first driving voltage line of the red pixel is the same as the width of the third driving voltage line of the blue pixel.

2. The organic light emitting diode (OLED) display as claimed in claim 1, wherein a width of the driving voltage lines increases as a luminance change of an associated pixel to a voltage drop increases such that the first pixel, the second pixel, and the third pixel have uniform luminance.

3. The organic light emitting diode (OLED) display as claimed in claim 1, wherein the data line and the driving line intersect the scan line.

4. The organic light emitting diode (OLED) display as claimed in claim 1, further comprising:
a switching transistor connected to the scan line and the data line;
a driving transistor connected to the switching transistor and the driving voltage line;
a pixel electrode connected to the driving transistor;
an organic emission layer on the pixel electrode; and
a common electrode on the organic emission layer.

5. An organic light emitting diode (OLED) display including a first pixel, a second pixel, and a third pixel disposed in a matrix, the organic light emitting diode (OLED) display comprising:
a scan line configured to transmit a scan signal;
a data line insulated from the scan line, the data line configured to transmit a data signal; and
a driving voltage line insulated from the scan line, the driving voltage line including a first driving voltage line configured to transmit a driving voltage to the first pixel, a second driving voltage line configured to transmit the driving voltage to the second pixel, and a third driving voltage line configured to transmit the driving voltage to the third pixel, wherein a width of one driving voltage line among the first driving voltage line to the third driving voltage line is different from widths of other driving voltage lines among the first to third driving voltage lines,
wherein the first pixel, the second pixel, and the third pixel are a red pixel, a green pixel, and a blue pixel, respectively, the width of the second driving voltage line of the green pixel is the same as the width of the first driving voltage line of the red pixel, and the width of the second driving voltage line of the green pixel is larger than the width of the third driving voltage line of the blue pixel.

6. An organic light emitting diode (OLED) display including a first pixel, a second pixel, and a third pixel disposed in a matrix, the organic light emitting diode (OLED) display comprising:
a scan line configured to transmit a scan signal;
a data line insulated from the scan line, the data line configured to transmit a data signal; and
a driving voltage line insulated from the scan line, the driving voltage line including a first driving voltage line configured to transmit a driving voltage to the first pixel, a second driving voltage line configured to transmit the driving voltage to the second pixel, and a third driving voltage line configured to transmit the driving voltage to the third pixel, wherein a width of one driving voltage line among the first driving voltage line to the third driving voltage line is different from widths of other driving voltage lines among the first to third driving voltage lines,
wherein the first pixel, the second pixel, and the third pixel are a red pixel, a green pixel, and a blue pixel, respectively, the width of the third driving voltage line of the blue pixel is the same as the width of the first driving voltage line of the red pixel, and the width of the second driving voltage line of the green pixel is larger than the width of the third driving voltage line of the blue pixel.

* * * * *